United States Patent
Wu et al.

(10) Patent No.: US 8,427,219 B1
(45) Date of Patent: Apr. 23, 2013

(54) CLOCK GENERATOR AND A METHOD OF GENERATING A CLOCK SIGNAL

(75) Inventors: Ching-Cheng Wu, Hsinchu (TW); Chih-Yu Chuang, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 38 days.

(21) Appl. No.: 13/311,354

(22) Filed: Dec. 5, 2011

(51) Int. Cl.
*G06F 1/04* (2006.01)

(52) U.S. Cl.
USPC ........... 327/291; 327/294; 327/154; 327/155; 331/44

(58) Field of Classification Search .......... 327/154–155, 327/291–294, 299; 331/17, 44
See application file for complete search history.

(56) References Cited

U.S. PATENT DOCUMENTS

| | | | | |
|---|---|---|---|---|
| 5,382,922 A * | 1/1995 | Gersbach et al. | ............. | 331/1 A |
| 7,382,199 B2 * | 6/2008 | Talwalkar | ........................ | 331/16 |
| 7,746,182 B2 * | 6/2010 | Ramaswamy et al. | .......... | 331/44 |
| 2012/0056682 A1 * | 3/2012 | Satoh et al. | ..................... | 331/18 |

* cited by examiner

*Primary Examiner* — An Luu
(74) *Attorney, Agent, or Firm* — Stout, Uxa, Buyan & Mullins, LLP (57) ABSTRACT

The present invention is directed to a clock generator and a method of generating a clock signal. A digital control oscillator (DCO) generates a clock signal. A first frequency calibration unit extracts a periodic signal and determines a frequency error quantity between the extracted periodic signal and a derived clock signal. A second frequency calibration unit generates a coarse tuning signal when an absolute value of the frequency error quantity is greater than a first predetermined threshold, and generates a fine tuning signal when the absolute value of the frequency error quantity is less than a second predetermined threshold.

17 Claims, 6 Drawing Sheets

CLOCK GENERATOR AND A METHOD OF GENERATING A CLOCK SIGNAL

BACKGROUND OF THE INVENTION

1. Field of the Invention

The present invention generally relates to a communication system, and more particularly to a clock generator and a method of generating a clock signal adaptable to the communication system.

2. Description of Related Art

Figure 1:
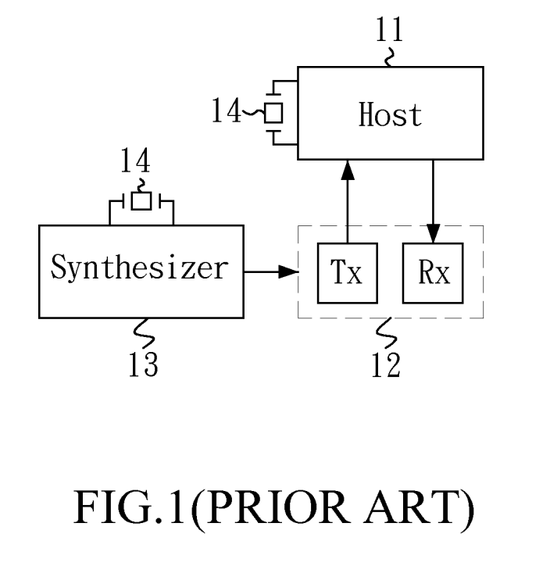
FIG. 1 shows a block diagram illustrative of a conventional communication system.

In a communication system constructed in a serializer/deserializer (Ser/Des) interface architecture, a SerDes link or serial bus, such as Universal Serial Bus (USB), Serial Advanced Technology Attachment (SATA) or Peripheral Component Interconnect Express (PCI Express), is generally utilized to connect a host with an electronic device. FIG. 1 shows a block diagram illustrative of a conventional communication system. The system generally includes a host 11 and an electronic device 12. A synthesizer 13, such as a phase-locked loop (PLL) or a spread spectrum clock generator (SSCG), is commonly used with the transmitter/receiver 121/122 of the electronic device 12. It is noted that a resonator 14 (e.g., a quartz crystal, LC tank or RC bank) is required to work with the synthesizer 13 or the host 11 to provide a stable and accurate clock source. However, as the resonator 14 is oftentimes bulky and/or consumes substantive power, some highly integrated systems such as a pen drive thus cannot afford enough space or power. Although an embedded oscillator based on chip-on-board (COB) technique has been proposed, the additionally incurred cost, however, outweighs its benefit.

Accordingly, a need has arisen to propose a novel scheme and method of generating a clock signal for optimizing area and power consumption in a cost efficient manner.

SUMMARY OF THE INVENTION

In view of the foregoing, it is an object of the embodiment of the present invention to provide a clock generator and a method of generating a clock signal adaptable to an electronic device in a communication system. The embodiment optimizes area and power consumption of a clock generator and provides an efficient and economic scheme of calibrating frequency for different tuning range.

According to one embodiment, a digital control oscillator (DCO) is configured to generate a clock signal. A first frequency calibration unit is configured to determine validity of a receiving signal, and detect and extract a periodic signal enclosed in the receiving signal, wherein the first frequency calibration unit determines a frequency error quantity between the extracted periodic signal and a derived clock signal derived from the clock signal when the receiving signal is valid. A second frequency calibration, unit is configured to generate a coarse tuning signal to the DCO according to the frequency error quantity when an absolute value of the frequency error quantity is greater than a first predetermined threshold. The second frequency calibration unit generates a fine tuning signal to the DCO according to the frequency error quantity when the absolute value of the frequency error quantity is less than a second predetermined threshold that is less than the first predetermined threshold.

DETAILED DESCRIPTION OF THE INVENTION

Figure 2:
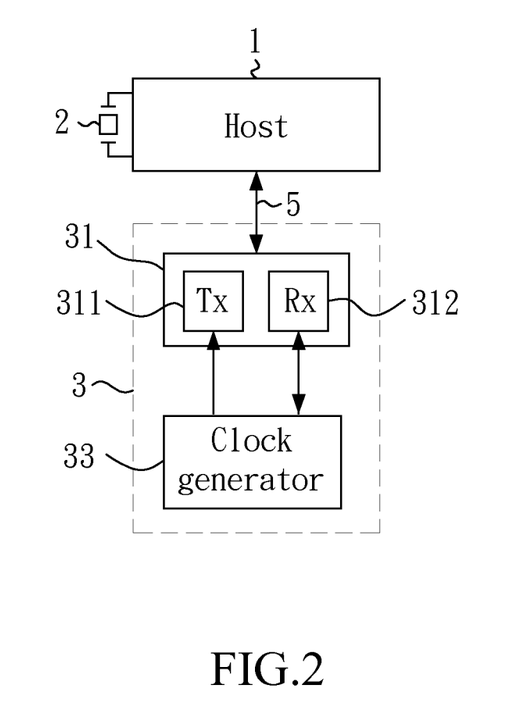
FIG. 2 shows a block diagram illustrative of a communication system according to one embodiment of the present invention.

FIG. 2 shows a block diagram illustrative of a communication system having a host 1 (e.g., a computer) connected with an electronic device 3 (e.g., a flash drive) via a serial bus 5, according to one embodiment of the present invention. The host 1 and/or the electronic device ("device" hereinafter) 3 in the illustrated communication system may generally utilize a serializer/deserializer (Ser/Des) interface architecture. The serial bus 5 is exemplified by Universal Serial Bus (USB), particularly USB 2.0, in the embodiment. However, other serial bus standards, such as Serial Advanced Technology Attachment (SATA) or Peripheral Component Interconnect Express (PCI Express), may be adopted instead.

Specifically speaking, the host 1 uses a resonator 2 (e.g., a quartz crystal) to provide a clock signal. The device 3 primarily includes a transmitter (TX) 311 and a receiver (RX) 312, which are collectively called a transceiver 31. It is specifically noted that the transceiver 31 of the embodiment does not use a resonator such as a quartz crystal to provide a clock signal for the transceiver 31, but utilizes a clock generator 33 instead, thereby reducing volume and cost while maintaining frequency accuracy.

Figure 3:
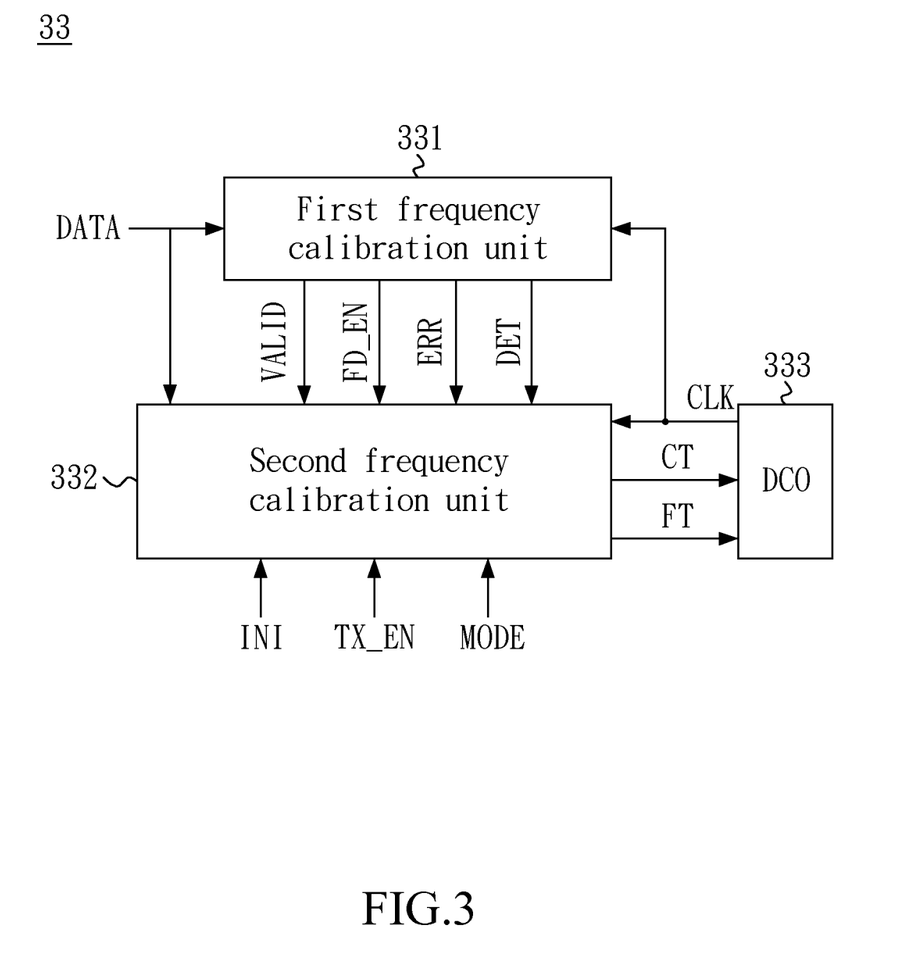
FIG. 3 shows a detailed block diagram of the clock generator of FIG. 2 according to the embodiment of the present invention.

FIG. 3 shows a detailed block diagram of the clock generator 33 of FIG. 2 according to the embodiment of the present invention. In the embodiment, the clock generator 33 includes a first frequency calibration, unit 331, a second frequency calibration unit 332 and a digital control oscillator (DCO) 333. Generally speaking, the first frequency calibration unit 331 determines validity of an incoming receiving signal DATA from the host 1. The valid receiving signal DATA is asserted by a valid signal VALID that is also fed to the second frequency calibration unit 332. The first frequency calibration unit 331 detects and extracts a periodic signal, such as a start of frame (SOF) signal, enclosed in the receiving signal DATA.

Subsequently, when the receiving signal DATA is valid, the first frequency calibration unit 331 determines a frequency error quantity between the extracted periodic signal and a generated clock signal CLK (or its derived or divided clock signal) from the DCO 333. The frequency error quantity is conveyed via a frequency error signal ERR, and is fed to the second frequency calibration unit 332. When the absolute value of the frequency error quantity is greater than a first predetermined threshold (e.g., 3000 ppm), the second frequency calibration, unit 332 generates a coarse tuning signal CT, according to the frequency error quantity, to control the DCO 333 in order to initially (or coarsely) reduce the frequency error quantity. With respect to some operating speed mode such as a high speed mode in USB 2.0, when the absolute value of the frequency error quantity is less than a second predetermined threshold (e.g., 1000 ppm) that is less than the first predetermined threshold, the second frequency calibration unit 332 generates a fine tuning signal FT, according to the frequency error quantity (i.e., the frequency error signal ERR) and the comparison between the clock signal CLK and the receiving signal DATA, to control the DCO 333 in order to further (or finely) reduce the frequency error quantity.

It is particularly noted that the DCO 333 of the embodiment is controlled by the second frequency calibration unit 332 in a digital manner, that is, under control of digital control signals such as the coarse tuning signal CT and the fine tuning signal FT. The DCO 333 of the embodiment eliminates the use of a bulky resonator such as quartz crystal, LC tank or RC bank. Moreover, the value represented by the coarse tuning signal CT and/or the fine tuning signal FT may be recorded during the operation of the clock generator 33, for example, in a register, that may be disposed in or out of the clock generator 33. The recorded coarse/fine tuning signal CT/FT may be applicable even after system suspended. The recorded coarse/fine tuning signal CT/FT may be erased after power off or system restarted.

Figure 4:
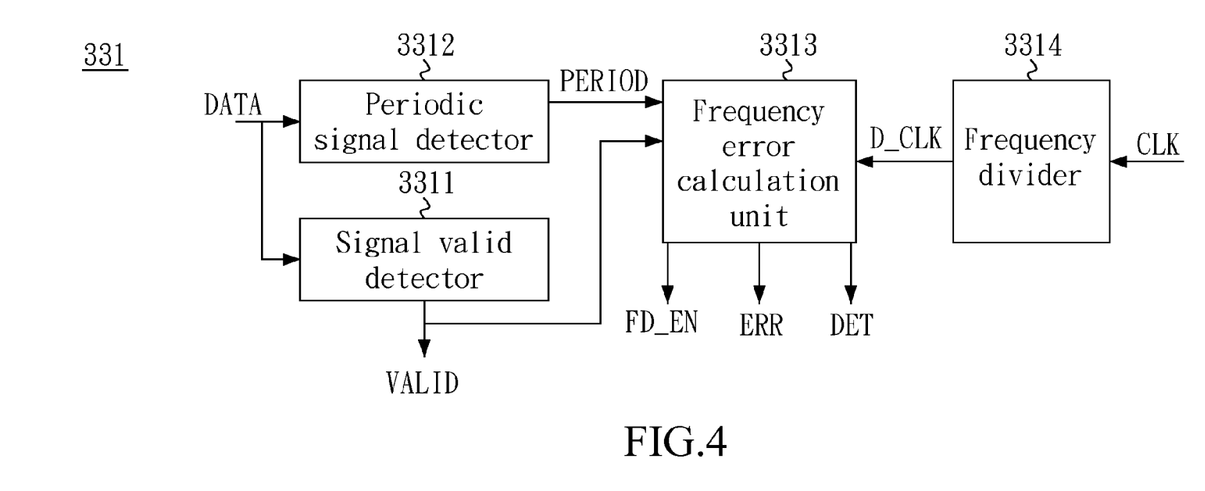
FIG. 4 shows a detailed block diagram of the first frequency calibration unit of FIG. 3 according to the embodiment of the present invention.

FIG. 4 shows a detailed block diagram of the first frequency calibration unit 331 of FIG. 3 according to the embodiment of the present invention. In the embodiment, the first frequency calibration unit 331 includes a signal valid detector 3311, a periodic signal detector 3312, a frequency error calculation unit 3313 and a frequency divider 3314. Specifically, the signal valid detector 3311 receives the receiving signal DATA to determine the validity of the receiving signal DATA. The validity of the receiving signal DATA is asserted by the valid signal VALID. The periodic signal detector 3312 detects the existence of the periodic signal such as SOF signal and outputs an extracted periodic signal PERIOD, if it exists. The frequency error calculation unit 3313 may be enabled by the asserted valid signal VALID to perform determination of the frequency error quantity by comparing the extracted periodic signal PERIOD and the derived (or divided) clock signal D_CLK. The divided clock signal D_CLK is derived from the clock signal CLK by a frequency divider 3314 such that the frequency of the divided clock signal D_CLK is comparable to the frequency of the extracted periodic signal PERIOD. It is appreciated that the frequency divider 3314 may be omitted or bypassed if the frequency of the clock signal CLK is comparable to the frequency of the extracted periodic signal PERIOD. The determined frequency error quantity is conveyed by the frequency error signal ERR. Moreover, in the embodiment, the frequency error calculation unit 3313 generates a periodic signal detected signal DET, which is triggered whenever the periodic signal is identified. The asserted periodic signal detected signal DET is used to initiate a stage of coarsely tuning the DCO 333. The frequency error calculation unit 3313 also generates a frequency detector enable signal FD_EN, which is asserted when the absolute value of the frequency error quantity is less than the second predetermined threshold. The asserted frequency detector enable signal FD_EN is used to initiate another stage of finely tuning the DCO 333.

Figure 5:
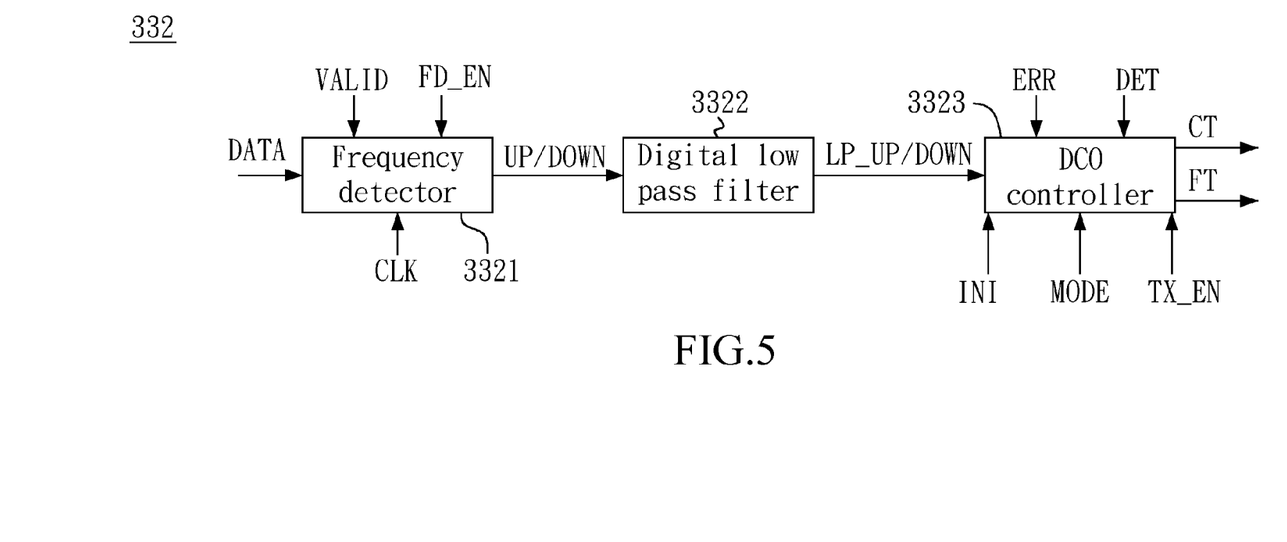
FIG. 5 shows a detailed block diagram of the second frequency calibration unit of FIG. 3 according to the embodiment of the present invention.

FIG. 5 shows a detailed block diagram of the second frequency calibration unit 332 of FIG. 3 according to the embodiment of the present invention. In the embodiment, the second frequency calibration unit 332 includes a frequency detector 3321, a digital low pass filter 3322 and a DCO controller 3323. Specifically, the frequency detector 3321, enabled by the asserted valid signal VALID and the asserted frequency detector enable signal FD_EN, compares the clock signal CLK with the receiving signal DATA in frequency. Accordingly, the frequency detector 3321 generates an up/down signal UP/DOWN. For example, if the clock signal CLK has a frequency below the receiving signal DATA, the up signal is generated; if the clock signal CLK has a frequency above the receiving signal DATA, the down signal is generated. Afterwards, the digital low pass filter 3322 may be selectively used to suppress or reject deterministic jitter (DJ) and/or data dependent jitter (DDJ). The digital low pass filter 3322 may adopt an adaptive tuning sequence for bandwidth adjustment. For example, a wider bandwidth is provided, at the beginning for higher tracing speed, and a narrower bandwidth is then subsequently provided for higher rejection of signal jitter such as intersymbol interference (ISI), DDJ, crosstalk, etc. The low passed up/down signal LP_UP/DOWN, or the up/down signal UP/DOWN if the digital low pass filter 3322 is omitted, is then fed to the DCO controller 3323, which is also coupled to receive the frequency error signal ERR and the periodic signal detected signal DET. Accordingly, as described above, the DCO controller 3323 generates or adjusts the coarse tuning signal CT and the fine tuning signal FT to control the DCO 333 in order to reduce the frequency error quantity coarsely and finely, respectively.

As shown in the figure, the DCO controller 3323 also receives an initial DCO value INI as an initial coarse tuning signal CT and a fine tuning signal FT; a speed mode signal MODE indicating the operating speed such as high speed mode or full speed mode in USB 2.0; and a transmission, enable signal TX_EN, wherein a de-asserted transmission enable signal (e.g., TX_EN=0 or when the device 3 is under a receiving mode) enables the DCO controller 3323.

Figure 6:
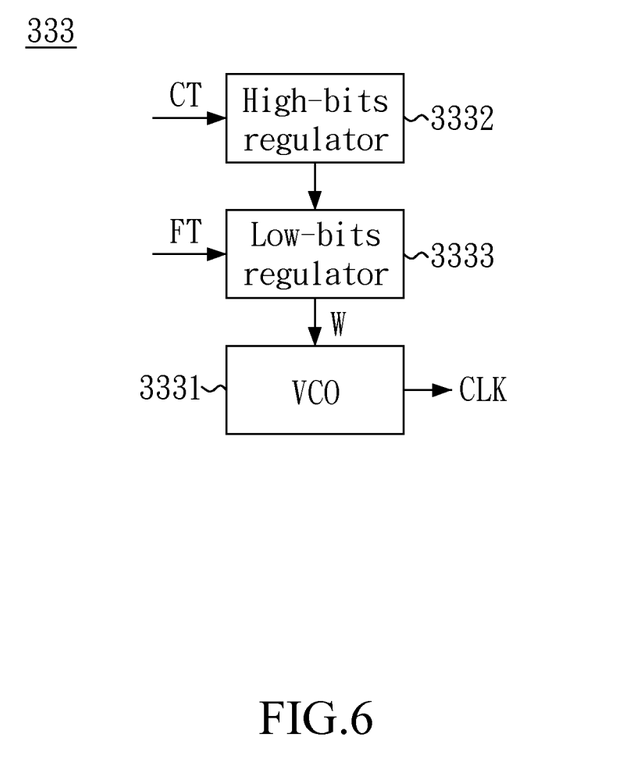
FIG. 6 shows a detailed block diagram of the DCO of FIG. 3 according to the embodiment of the present invention.

FIG. 6 shows a detailed block diagram of the DCO 333 of FIG. 3 according to the embodiment of the present invention. In the embodiment, the DCO 333 includes a voltage-controlled oscillator (VCO) 3331, and at least two digitally-controlled voltage regulators 3332 and 3333. In the embodiment, a high-bits voltage regulator 3332 such as a low-dropout regulator is controlled by the coarse tuning signal CT and a low-bits regulator 3333 is controlled by the fine tuning signal FT. The high-bits voltage regulator 3332 and the low-bits regulator 3333 may alternatively be implemented, for example, by a digital-to-analog converter (DAC) or a digitally-controlled resistor acted. A first output voltage of the high-bits voltage regulator 3332 and a second output voltage of the low-bits regulator 3333 are blended, resulting in a voltage input VV to the VCO 3331, wherein the first output voltage contributes to high-significant digit (or high-significant bits) of the voltage input VV to the VCO 3331, and the second output voltage contributes to low-significant digit (or low-significant bits) of the voltage input VV to the VCO 3331. For example, if the voltage input VV is equivalently represented in binary form as 0110 1101, the first output voltage of the high-bits voltage regulator 3332 may contribute to the high-significant bits 0110, and the low-bits regulator 3333 may contribute to the low-significant bits 1101. The VCO 3331 then generates the clock signal CLK according to the voltage input VV provided by the digitally-controlled voltage regulators 3332 and 3333. Details of implementing the DCO may be referred to Song et al. "A 1.0-4.0-Gb/s All-Digital CDR With 1.0-ps Period Resolution DCO and Adaptive Proportional Gain Control" (IEEE Journal of Solid-State Circuits, Vol. 46, No. 2, February 2011), the disclosure of which is hereby incorporated herein by reference.

Figure 7A:
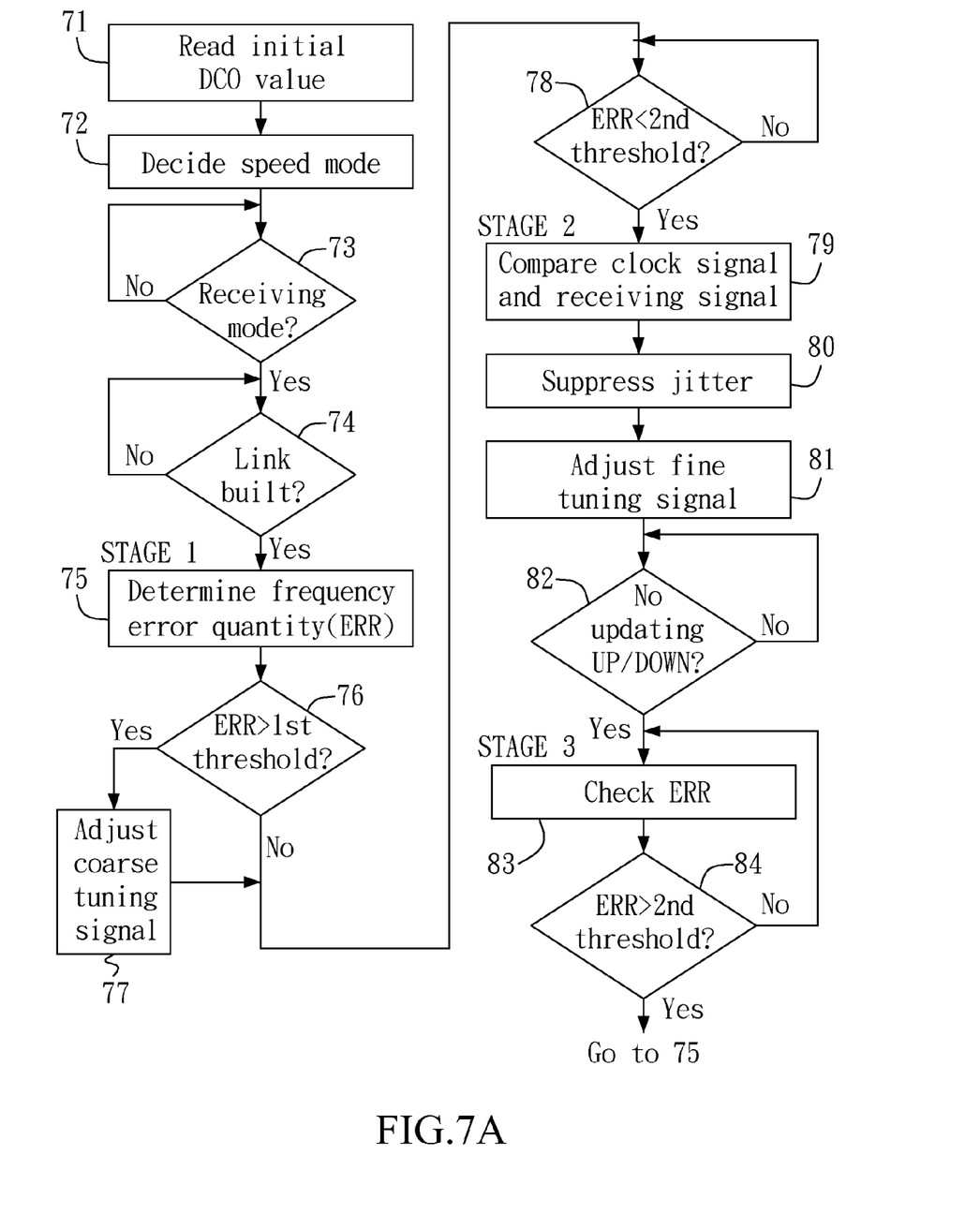
FIG. 7A shows a flow diagram illustrative of a method of generating a clock signal according to one embodiment of the present invention.
Figure 7B:
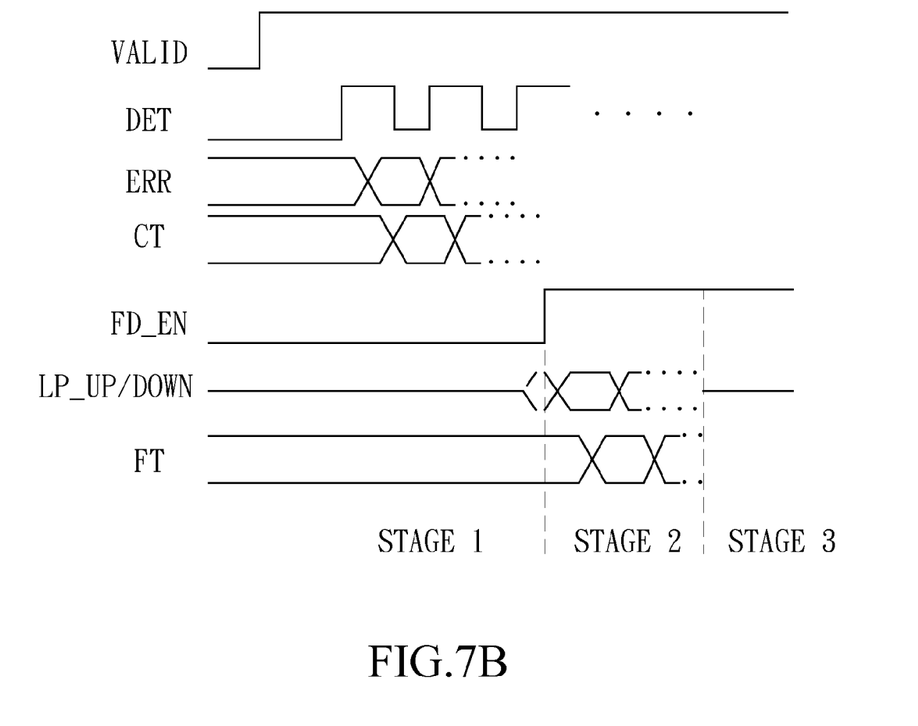
FIG. 7B shows exemplary signal waveforms pertinent to the embodiment in a high speed mode.

FIG. 7A shows a flow diagram illustrative of a method of generating a clock signal CLK according to one embodiment of the present invention, and FIG. 7B shows exemplary signal waveforms pertinent to the embodiment. The method of the embodiment as illustrated in FIG. 7A may, for example, be adapted to high speed mode of USB 2.0, and may generally include three stages: stage 1, stage 2 and stage 3.

At the beginning, the initial DCO value INI is read (step 71) to result in an initial clock signal CLK after power becomes stable and an initial reset is performed. Subsequently, handshaking sequence is carried out between the host 1 and the device 3 to decide a speed mode (step 72), for example, high speed mode or a full speed mode as defined in USB 2.0. As the speed mode is decided, data communication between the host 1 and the device 3 proceeds accordingly. In step 73, it is determined whether the device 3 is under a receiving mode (i.e., the transmission enable signal TX_EN=0). The following frequency calibration steps proceed only when the device 3 is determined to be currently under a receiving mode.

In step 74, it is determined whether a link has been built between the host 1 and the device 3. In the embodiment, the link is determined to be built when an incoming receiving signal DATA from the host 1 is valid (with an asserted valid signal VALID) and a periodic signal (e.g., SOF signal) is detected (with a triggered periodic signal detected signal DET). When the link has been built, the flow enters stage 1, and an extracted periodic signal PERIOD and the clock signal CLK (or a derived (or divided) clock frequency D_CLK) are compared to determine frequency error quantity (step 75), which is conveyed via the frequency error signal ERR.

In step 76, when the absolute value of the frequency error quantity is greater than a first predetermined threshold (e.g., 3000 ppm), the coarse tuning signal CT is adjusted (by the second frequency calibration unit 332) (step 77), according to the frequency error quantity, to control the DCO 333 in order to initially (or coarsely) reduce the frequency error quantity, while maintaining the fine tuning signal FT.

In step 78, when the absolute value of the frequency error quantity is less than a second predetermined threshold (e.g., 1000 ppm) that is less than the first predetermined threshold, the frequency detector enable signal FD_EN is asserted (in addition to the asserted valid signal VALID), and the flow proceeds to stage 2. In step 79, the clock signal CLK is compared with the receiving signal DATA in frequency by the frequency detector 3321, which accordingly generates the up/down signal UP/DOWN. The up/down signal UP/DOWN may selectively be subjected to low pass filtering (by the digital low pass filter 3322) to suppress or reject deterministic jitter (DJ) and/or data dependent jitter (DDJ) (step 80).

Subsequently, in step 81, the fine tuning signal FT is adjusted (by the DCO controller 3323), according to the frequency error quantity and the comparison result between the clock signal CLK and the receiving signal DATA, to control the DCO 333 in order to further (or finely) reduce the frequency error quantity. Stage 2 continues until no updating (or changing) about the up/down signal UP/DOWN (step 82) within (predetermined) N times of triggered periodic signal detected signal DET, in that case the flow proceeds to stage 3.

In stage 3, the frequency error quantity (i.e., the frequency error signal ERR) is continuously or intermittently checked and the fine tuning signal FT is adjusted due to system environment change (step 83). Stage 3 continues until the frequency error quantity is greater than the second predetermined threshold (step 84), the flow then proceeds back to stage 1.

Figure 7C:
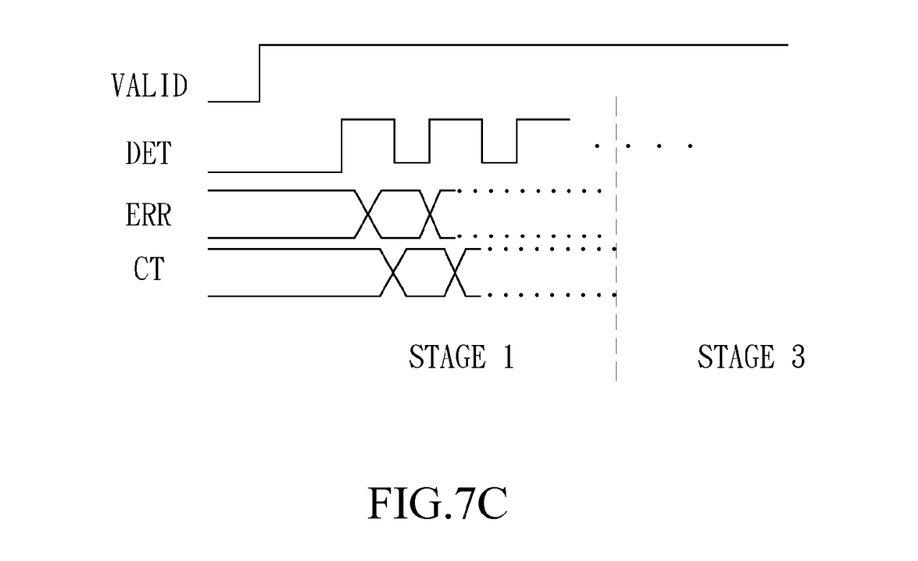
FIG. 7C shows exemplary signal waveforms pertinent to the embodiment in a full speed mode.

With respect to a full speed mode, the stage 2 in the flow as illustrated in FIG. 7A may be bypassed. FIG. 7C shows exemplary signal waveforms pertinent to the embodiment in the full speed mode.

Although specific embodiments have been illustrated and described, it will be appreciated by those skilled in the art that various modifications may be made without departing from the scope of the present invention, which is intended to be limited solely by the appended claims.

What is claimed is:

1. A clock generator, comprising:
a digital control oscillator (DCO) configured to generate a clock signal;
a first frequency calibration unit configured to determine validity of a receiving signal, and detect and extract a periodic signal enclosed in the receiving signal, wherein the first frequency calibration unit determines a frequency error quantity between the extracted periodic signal and a derived clock signal derived from the clock signal when the receiving signal is valid; and
a second frequency calibration unit configured to generate a coarse tuning signal to the DCO according to the frequency error quantity when an absolute value of the frequency error quantity is greater than a first predetermined threshold;
wherein the second frequency calibration unit generates a fine tuning signal to the DCO according to the frequency error quantity when the absolute value of the frequency error quantity is less than a second predetermined threshold that is less than the first predetermined threshold.

2. The clock generator of claim 1, wherein the first frequency calibration, unit comprises:
a signal valid detector coupled to receive the receiving signal to determine the validity of the receiving signal, wherein the validity of the receiving signal is asserted by a valid signal;
a periodic signal detector configured to detect existence of the periodic signal and then output an extracted periodic signal; and
a frequency error calculation unit enabled by the asserted valid signal to perform determination of the frequency error quantity by comparing the extracted periodic signal and the derived clock signal.

3. The clock generator of claim 2, wherein the first frequency calibration unit further comprises a frequency divider configured to divide the clock signal to obtain the derived clock signal.

4. The clock generator of claim 2, wherein the frequency error calculation unit generates a periodic signal detected signal, which is triggered whenever the periodic signal is identified and is used to initiate a coarse tuning stage to tune the DCO.

5. The clock generator of claim 2, wherein the frequency error calculation unit generates a frequency detector enable signal, which is asserted when the absolute value of the frequency error quantity is less than the second predetermined threshold, wherein the asserted frequency detector enable signal is used to initiate a fine tuning stage to tune the DCO.

6. The clock generator of claim 5, wherein the second frequency calibration unit comprises:
a frequency detector enabled by the asserted valid signal and the asserted frequency detector enable signal to compare the clock signal with the receiving signal, thereby generating an up/down signal; and a DCO controller configured to adjust the fine tuning signal and the coarse tuning signal according to the up/down signal and the frequency error quantity.

7. The clock generator of claim 6, wherein the DCO controller is enabled by a de-asserted transmission enable signal, which is de-asserted in a receiving mode.

8. The clock generator of claim 6, wherein the second frequency calibration unit further comprises a digital low pass filter configured to suppress jitter of the up/down signal.

9. The clock generator of claim 1, wherein the DCO comprises:
a voltage-controlled oscillator (VCO); and
at least two digitally-controlled voltage regulators controlled by the coarse tuning signal and the fine tuning signal respectively, wherein outputs of the digitally-controlled voltage regulators are fed to the VCO.

10. The clock generator of claim 9, wherein the at least two digitally-controlled voltage regulators comprise:
a high-bits voltage regulator controlled by the coarse tuning signal; and
a low-bits regulator controlled by the fine tuning signal;
wherein a first output voltage of the high-bits voltage regulator and a second output voltage of the low-bits regulator are blended, resulting in a voltage input to the VCO, wherein the first output voltage contributes to high-significant bits of the voltage input to the VCO, and the second output voltage contributes to low-significant bits of the voltage input to the VCO.

11. A method of generating a clock signal, comprising:
determining whether a link has been built between a host and a device;
comparing an extracted periodic signal and a clock signal to determine frequency error quantity;
adjusting a coarse tuning signal when an absolute value of the frequency error quantity is greater than a first predetermined threshold;
comparing the clock signal with a receiving signal when the absolute value of the frequency error quantity is less than a second predetermined threshold that is less than the first predetermined threshold, thereby generating an up/down signal;
adjusting a fine tuning signal according to the frequency error quantity and comparison result between the clock signal and the receiving signal; and
checking the frequency error quantity when no updating about the up/down signal within a predetermined duration, until the frequency error quantity is greater than the second predetermined threshold.

12. The method of claim 11, wherein the link is determined to be built when a receiving signal is valid and a periodic signal enclosed in the receiving signal is detected.

13. The method of claim 11, wherein the up/down signal is subjected to low pass filtering before adjusting the fine tuning signal.

14. The method of claim 11, further comprising a step of determining a receiving mode.

15. The method of claim 11, further comprising a step of:
reading an initial DCO value to result in an initial clock signal.

16. The method of claim 11, further comprising a step of: determining a speed mode.

17. The method of claim 11, wherein the host is connected to the device via a serial bus compliant with Universal Serial Bus (USB) standard.

* * * * *